United States Patent
Talanov et al.

(10) Patent No.: US 9,722,589 B1
(45) Date of Patent: Aug. 1, 2017

(54) CLOCK DISTRIBUTION NETWORK FOR A SUPERCONDUCTING INTEGRATED CIRCUIT

(71) Applicant: Microsoft Technology Licensing, LLC, Redmond, WA (US)

(72) Inventors: Vladimir V. Talanov, Ellicott City, MD (US); Joshua A. Strong, Columbia, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/099,802

(22) Filed: Apr. 15, 2016

(51) Int. Cl.
*H03K 3/00* (2006.01)
*H03K 5/15* (2006.01)

(52) U.S. Cl.
CPC ................. *H03K 5/15013* (2013.01)

(58) Field of Classification Search
CPC ..... G06F 1/10; G06F 1/04; H01L 2924/0002; H01L 2924/00
See application file for complete search history.

(56) References Cited

U.S. PATENT DOCUMENTS

| | | | |
|---|---|---|---|
| 5,825,240 A | 10/1998 | Geis et al. | |
| 6,549,059 B1 | 4/2003 | Johnson | |
| 8,571,614 B1 | 10/2013 | Mukhanov et al. | |
| 9,088,059 B1 | 7/2015 | Church et al. | |
| 2005/0114820 A1 | 5/2005 | Restle | |
| 2006/0066422 A1 | 3/2006 | Itoh et al. | |
| 2009/0245146 A1 | 10/2009 | Gummalla et al. | |
| 2010/0039193 A1 | 2/2010 | Ryou et al. | |
| 2011/0065586 A1* | 3/2011 | Maibaum | B82Y 10/00 505/170 |
| 2014/0062562 A1* | 3/2014 | Sathe | G06F 1/10 327/294 |

OTHER PUBLICATIONS

Park, et al., "Epsilon Negative Zeroth-Order Resonator Antenna", In Proceedings of IEEE Transactions on Antennas and Propagation, vol. 55, Issue 12, Dec. 2007, 3710-3712.

Sanada, et al., "Novel Zeroth-Order Resonance in Composite Right/Left-Handed Transmission Line Resonators", In Proceedings of Asia-Pacific Microwave Conference, vol. 3, Nov. 2003, 4 pages.

(Continued)

Primary Examiner — Sibin Chen
(74) Attorney, Agent, or Firm — Singh Law, PLLC; Ranjeev Singh

(57) ABSTRACT

A superconducting integrated circuit including a clock distribution network for distributing a clock signal in the superconducting integrated circuit is provided. The clock distribution network may include a clock structure having unit cells, where each of the unit cells may include at least one spine and at least one stub. The clock structure may further include at least one spine connected to the at least one stub, where the at least one stub may further be inductively coupled to at least one superconducting element. The clock signal may have a wavelength. Each of the unit cells may be spaced apart from each other along the clock structure by a distance, where the distance may be less than one tenth of the wavelength.

20 Claims, 4 Drawing Sheets

(56) References Cited

OTHER PUBLICATIONS

Liu, et al., "Metamaterial Transmission Line and its Applications", In Publication of InTech, Mar. 1, 2010, pp. 249-275.
Oberg, Oliver Timothy, "Superconducting Logic Circuits Operating with Reciprocal Magnetic Flux Quanta", In Doctoral Dissertation of Department of Physics, Jan. 13, 2016, 337 pages.
Herr, et al., "Ultra-Low-Power Superconductor Logic", In Journal of Applied Physics, vol. 109, Issue 10, May 2011, 7 pages.
Mesgarzadeh, Behzad, "Simultaneous Switching Noise Reduction by Resonant Clock Distribution Networks", In Journal of Integration, vol. 47, Issue 2, Mar. 2014, 2 pages.
Likharev, et al., "RSFQ Logic/Memory Family: A New Josephson-Junction Technology for Sub-Terahertz-Clock-Frequency Digital Systems", In Proceedings of IEEE Transactions on Applied Superconductivity, vol. 1, Issue 1, Mar. 1991, pp. 3-28.
Drake, et al., "Resonant Clocking Using Distributed Parasitic Capacitance", In Proceedings of IEEE Journal of Solid-State Circuits, vol. 39, Issue 9, Sep. 2004, pp. 1520-1528.
Krishnina, et al., "Zero delay Clocking System in GHz Frequency Regime Using CRLH Metamaterial Structure", In Proceedings of International Conference on Devices, Circuits and Systems, Mar. 15, 2012, 5 pages.
Caloz, et al., "Metamaterials for High-Frequency Electronics", In Proceedings of the IEEE, vol. 93, No. 10, Oct. 2005, pp. 1744-1752.
Klein, et al., "The Effective Microwave Surface Impedance of High-Tc Thin Films", In Journal of Applied Physics, vol. 67, No. 11, Jun. 1990, pp. 6940-6945.
Talanov, et al., "Measurement of the Absolute Penetration Depth and Surface Resistance of Superconductors and Normal Metals with the Variable Spacing Parallel Plate Resonator", In Review of Scientific Instruments, vol. 71, No. 5, May 2000, pp. 2136-2146.

* cited by examiner

CLOCK DISTRIBUTION NETWORK FOR A SUPERCONDUCTING INTEGRATED CIRCUIT

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, certain amount of power is wasted not only as a result of the requirement to maintain the state of the CMOS transistors, but also as a result of the current leakage.

An alternative approach to the use of processors and related components, based on CMOS technology, is the use of superconducting integrated circuits. Clock distribution in superconducting integrated circuits requires a different approach.

SUMMARY

In one example, the present disclosure relates to a clock distribution network for distributing a clock signal in a superconducting integrated circuit. The clock distribution network may include a first clock structure having a first plurality of unit cells, where each of the first plurality of unit cells may include at least one spine and at least one stub. The first clock structure may further include at least one spine connected to the at least one stub, where the at least one stub may further be inductively coupled to at least one first superconducting element. The clock signal may have a wavelength. Each of the first plurality of unit cells may be spaced apart from each other along the first clock structure by a distance, where the distance may be less than one tenth of the wavelength.

In another aspect, the present disclosure relates to a clock distribution network for distributing a clock signal in a superconducting integrated circuit. The clock distribution network may include a first clock structure, configured to provide in-phase clock signals, and a second clock structure, configured to provide quadrature-phase clock signals. The first clock structure may have a first plurality of unit cells, where each of the first plurality of unit cells may include at least one spine and a plurality of stubs. The first clock structure may further include at least one spine connected to the plurality of stubs, where each of the plurality of stubs may further be inductively coupled to at least one first superconducting element. The clock signal may have a wavelength. Each of the first plurality of unit cells may be spaced apart from each other along the first clock structure by a first distance, where the first distance may be less than one tenth of the wavelength. The second clock structure may have a second plurality of unit cells, where each of the second plurality of unit cells may include at least one spine and a plurality of stubs. The second clock structure may further include at least one spine connected to a plurality of stubs, where each of the plurality of stubs may further be inductively coupled to at least one second superconducting element. Each of the second plurality of unit cells may be spaced apart from each other along the second clock structure by a second distance, where the second distance may be less than one tenth of the wavelength.

In another aspect, the present disclosure relates to a clock distribution network for distributing a clock signal in a superconducting integrated circuit. The clock distribution network may include a first clock structure, configured to provide in-phase clock signals, and a second clock structure, configured to provide quadrature-phase clock signals. The first clock structure may have a first plurality of unit cells, where each of the first plurality of unit cells may include at least one spine and a plurality of stubs. The first clock structure may further include at least one spine connected to the plurality of stubs, where each of the plurality of stubs may further be inductively coupled to at least one first superconducting element. The first clock structure may be configured to be a first resonant structure, at a frequency of the clock signal, having substantially zero current along the at least one spine. The second clock structure may have a second plurality of unit cells, where each of the second plurality of unit cells may include at least one spine and a plurality of stubs. The second clock structure may further include at least one spine connected to a plurality of stubs, where each of the plurality of stubs may further be inductively coupled to at least one second superconducting element. The second clock structure may be configured to be a second resonant structure, at a frequency of the clock signal, having substantially zero current along the at least one spine.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
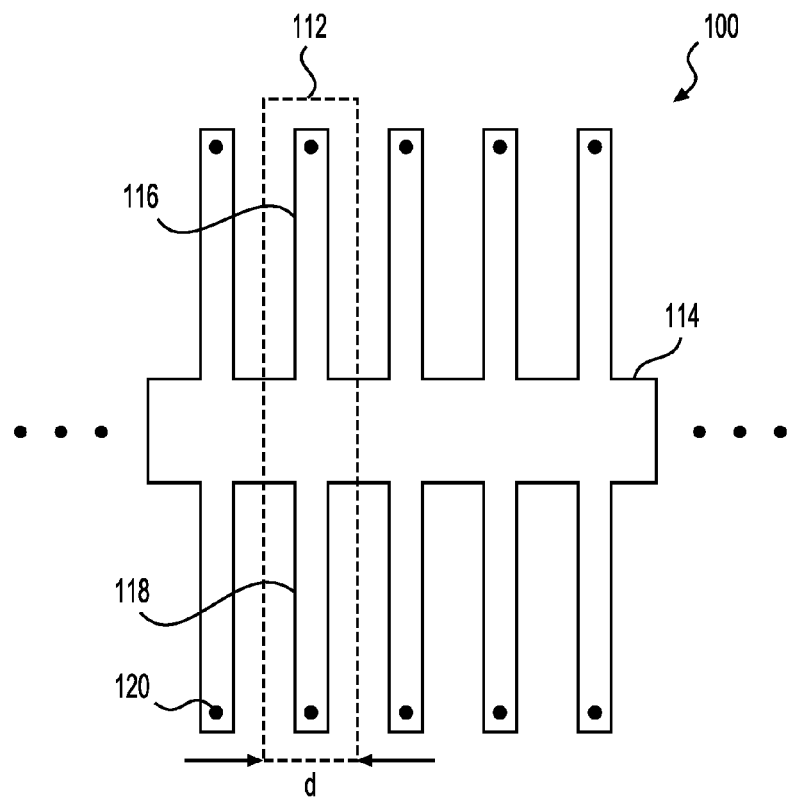
FIG. 1 shows a portion of a metamaterial transmission line (MTL) in accordance with one example.

Examples described in this disclosure relate to superconducting integrated circuits. Certain examples further relate to distributing clock signals in such superconducting integrated circuits. Certain examples further relate to reciprocal quantum logic (RQL) based superconducting integrated circuits. Such RQL based integrated circuits may include RQL circuits that may act as low-power superconductor logic circuits. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance below a critical temperature (Tc). An example superconductor Niobium has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate and a logical AND/OR gate. The AanB gate may have two inputs and one output (Q). An input pulse A may propagate to output Q when favorable clock conditions may be present on an output Josephson transmission line (JTL), unless an input pulse B comes first with respect to either input pulse A or the favorable clock conditions on the output JTL. In some instances, if the input pulse B arrives after the input pulse A, but before the favorable clock conditions at the output JTL, the input pulse A may appear to propagate through the AanB gate, but may be suppressed before favorable clock conditions allow it to propagate. The AND/OR gate may have two inputs and two outputs (Q1 and Q2). The first input pulse, input pulse A or input pulse B goes to output Q1 and the second input pulse goes to output Q2. The logical behavior of these gates is based on the reciprocal data encoding mentioned earlier. As an example, a positive pulse changes the internal flux state of the inductive loop, but the trailing negative pulse erases the internal state every clock cycle, which in turn produces combinational logic behavior.

Figure 2:
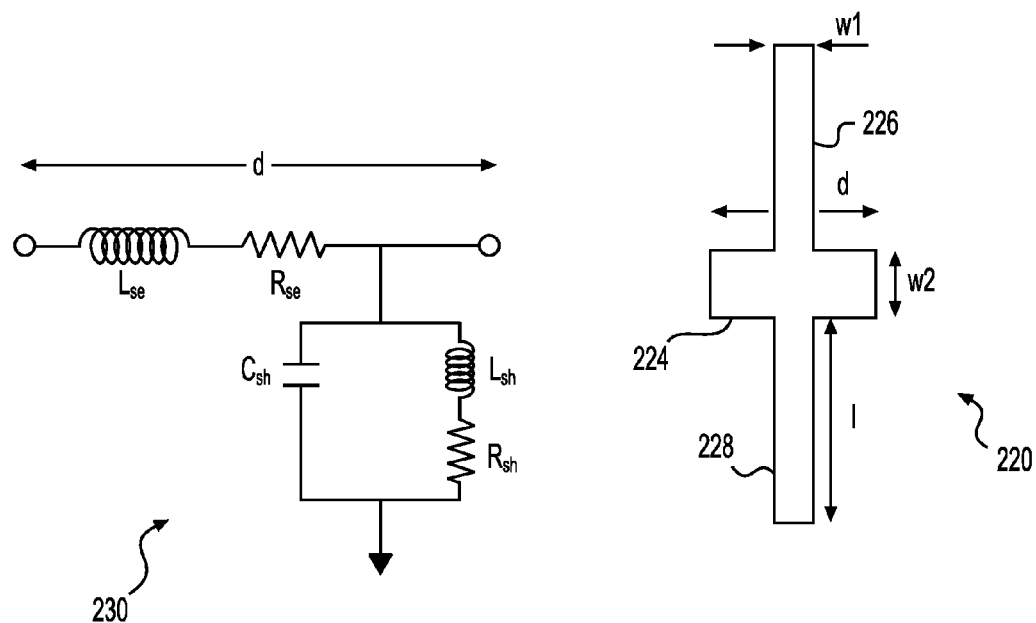
FIG. 2 shows an example unit cell for a MTL and an example electrical schematic of the unit cell.

In one example, clock and power to RQL circuits is provided by a harmonic radio frequency signal that may have a frequency in a range between 100 MHz to 100 GHz. Resonant clock networks (RCNs) may be used to distribute a clock signal that provides both power and clock to the RQL circuits. A clock network may deliver the clock signal to several taps distributed throughout a superconducting integrated circuit. The clock signal delivered at each tap needs to be substantially equal in amplitude and refer to a common phase with a high degree of precision. Such RCNs may advantageously use lower power by using metamaterial transmission lines (MTLs) as the clock structures. An exemplary MTL may be formed using a chain of identical unit cells. Each unit cell may be a passive microwave circuit having one or two inductive stubs, forming clock-lines, along a spine. Each stub may be formed using a short-circuited transmission line (e.g., a microstrip) that is approximately λ/4 long and provides shunt inductance. The spine of the clock structure may provide for the shunt capacitance and the series inductance as shown in FIG. 2. The clock structure (e.g., the MTL) may support zero-order resonance (ZOR) at a finite frequency, whose wavelength may be infinite along the direction of the spine, but finite along the direction of the stubs. The clock structure may be designed to resonate at the RQL clock frequency, e.g., the clock frequency that the RQL circuits need clocking at. Advantageously, each stub may carry radio frequency current with an almost identical amplitude and phase. As the spine is configured to carry substantially no current, all of the ohmic losses may be confined to the stubs only. This may advantageously provide for a RCN with up to 90% power efficiency. In addition, because ZOR provides for no amplitude and phase variation along the spine, the RCN may be advantageously scaled up to a sufficiently large number of stubs that cover the entire chip area of the superconducting integrated circuit.

The clock signal may be a sinusoidal clock that may provide AC power to the superconducting logic circuits. Two such clocks may provide a four-phase clock. In one example, cross-wired transformers (not shown) may be used to produce a four-phase clock from two clock signals. For example, by coupling the clock lines to the Josephson junctions in the gates of a respective superconducting circuit in a wound or counter-wound fashion, four phases of clock may be derived. The four phases of the clock may provide directionality to the single flux quantum (SFQ) pulses. Thus, as an example, with respect to a four-phase clock, the positive pulse may ride the leading edge of the clock from one phase to the next and arrive at the output after one cycle of delay and the negative pulse may follow with half a cycle of separation.

Clock distribution to various RQL circuit components in a chip may be accomplished by coupling current in the clock line, via RF bias transformers, to the RQL circuits. To ensure even amplitude and phase distribution of power across the entire chip, resonance clock networks (RCNs) may be used. A RCN may employ the standing wave resonance property to reduce clock delay. Since all of the alternating currents in a RCN are due to a standing wave, there may not be any phase variation from one part of the chip to another part of the chip. Certain RCNs may include several short clock lines that are inductively coupled to a central spine. Because the coupling coefficient is small, this approach requires high current in the central spine, which in turn leads to excessively high power consumption. Thus, this approach is not energy efficient. Moreover, a chip with RQL circuits may operate at a temperature that is half of the critical temperature (Tc). This may cause some portion of the current carriers in the superconductor to be normal electrons, instead of Cooper pairs. This may result in the superconductor being lossy at the resonant frequency of the RCN. To improve the efficiency of the RCN, the power dissipated in the RCN needs reduction. This may be accomplished by reducing the amount of current in the RCN. One approach may be to, instead of inductively coupling the clock lines to the resonator spine, couple the clock lines to the resonant spine galvanically. As a result, the current along the resonator spine may be substantially zero, and that may advantageously reduce the power consumption by the chip. In addition, the clock lines may be two to three times longer than traditional clock lines. This may allow much longer spine lengths, as well.

FIG. 1 shows a portion of a MTL 100 in accordance with one example. MTL 100 may include unit cells, such as unit cell 112, formed along a spine 114. MTL 100 may be formed by using any superconductor (e.g., Niobium), any normal metal (e.g., copper or aluminum), or any combination of such metals. Each unit cell 112 may include stubs 116 and 118, forming clock-lines. Each stub may be grounded at the respective end to a ground plane using a via, such as via 120. Each unit cell 112 may have a spine length of d. In one example, each unit cell may be formed by one or two inductive stubs that shunt a lumped element capacitor.

FIG. 2 shows an example unit cell 220 and an example electrical schematic 230 of unit cell 220. Unit cell 220 may be formed using a portion of spine 224 (having a length d) and stubs 226 and 228. Spine width may be w2. Each stub may have a length l and width w1. As shown in the corresponding electrical schematic 230, each unit cell 220, along the spine, may be represented by a series inductance $L_{se}$ and series resistance $R_{se}$. Electrical schematic 230 further shows shunt inductance $L_{sh}$, shunt resistance $R_{sh}$, and shunt capacitance $C_{sh}$. Thus, in this example, each unit cell 220 may be formed by one or two inductive stubs galvanically connected to a parallel plate capacitor (e.g., the spine portion may act as the parallel plate capacitor). Each stub may be formed by a short-circuited transmission line of up to $\lambda/4$ long, where $\lambda$ is the wavelength of the clock signal. In this example, the spine may be formed by galvanically connecting the capacitors. As needed, any number of unit cells may be connected in series to form a transmission line. Electromagnetic fields in the structure formed by a unit cell with two stubs (e.g., clock lines) are symmetric about the plane coincident with the spine mid-line, which presents a magnetic wall boundary condition. When exhibiting zero-order-resonance (ZOR) at frequency $\omega_{ZOR}=\sqrt{1/L_{sh}C_{sh}}$, the MTL may resemble a quasi-static resonator with capacitance $C=NC_{sh}$ formed by the N-unit-cell-long spine and inductance $L=L_{sh}/N$ formed by N inductive stubs shunting the spine capacitor. In one example, the input impedance ($Z_{in}$) of an inductive stub may be represented as $Z_{in}=Z_{0cl}\tan(\gamma_{cl}l)$, where $\gamma_{cl}=\alpha_{cl}+i\beta_{cl}$ is the stub (e.g., a clock-line) complex propagation constant, l is the stub (clock-line) length, and $$Z_{0cl} = \sqrt{\frac{\mu_0}{\varepsilon_0\varepsilon_r}} \frac{s}{w} \sqrt{1 - i\frac{2Z_{eff}}{\mu_0\omega s}}$$

is the stub (clock-line) characteristic impedance. In addition, $\mu_0$ is the vacuum permeability, $\varepsilon_0$ is the vacuum permittivity, $\varepsilon_r$ is the relative dielectric constant, s is the clock-line dielectric thickness, w is the clock-line width, $Z_{eff}=R_{eff}+iX_{eff}$ is the effective surface impedance of a superconducting film, and $\omega$ is the angular frequency of the clock signal. The propagation constant of the superconducting transmission line, forming the inductive stub, may be approximated by $$\gamma_{cl} = i\omega\sqrt{\varepsilon_0\varepsilon_r\mu_0(1-i\tan\delta)} \sqrt{1 - i\frac{2Z_{eff}}{\mu_0\omega s}}$$

where $\tan\delta$ is the dielectric loss tangent. The effective surface resistance and reactance of superconducting film of thickness t are respectively given by $$R_{eff} = R_s\left(\coth\frac{t}{\lambda} + \frac{t/\lambda}{\sinh^2(t/\lambda)}\right)$$

and $$X_{eff} = \mu_0\omega\lambda\coth\frac{t}{\lambda},$$

where $R_s$ is the superconductor intrinsic surface resistance, and $\Lambda$ is the London penetration depth. Assuming $\theta_{cl}l\ll 1$ then $Z_{in}$ may be approximated by $Z_{in}\approx Z_{0cl}\theta_{cl}l$. The real and imaginary parts of the input impedance ($Z_{in}$) per unit cell may specify the shunt resistance ($R_{sh}$) and shunt inductance ($L_{sh}$) of unit cell 220 as $R_{sh}=\text{Re}[Z_{in}]/2$ and $L_{sh}=(\text{Im}[Z_{in}]/\mu_0\omega)/2$, where the factor of 2 may account for the symmetry of unit cell 220 around the spine. Substituting values from the previous equations for the input impedance ($Z_{in}$) per unit cell and neglecting dielectric loss, shunt resistance ($R_{sh}$) and shunt inductance ($L_{sh}$) of unit cell 220 may be approximated as $R_{sh}\approx 2R_{eff}l/w$ and $$L_{sh} \approx \mu_0 l \frac{s + 2\lambda\coth(t/\lambda)}{w}.$$

In this example, the shunt capacitance ($C_{sh}$) of unit cell 220 may be represented as $$C_{sh} = 2\frac{\varepsilon_0 \varepsilon d(W/2)}{S},$$

where W is the spine width, and S is the spine dielectric thickness. In one example, the dielectric thickness of the spine may be different from the thickness of the stub (clock-line). The series inductance ($L_{se}$) may be approximated as $$L_{se} = \frac{1}{2}\mu_0 d \frac{S + 2\lambda\coth(t/\lambda)}{(W/2)}.$$

In one example, the MTL with unit cells 220 may advantageously be very efficient in terms of energy efficiency. The quality factor (Q) for the zero-order-resonance in the MTL may be independent of the spine resistance because the spine carries substantially zero current. That Q-factor may be represented as $$Q_{ZOR\Omega} = \frac{R_{ZOR}}{\omega_0 L_{ZOR}} = \frac{\omega_0 L_{sh}}{R_{sh}},$$

where $$R_{ZOR} = Z_{in}[\omega_0] = \frac{L_{sh}}{NR_{sh}C_{sh}}, L_{ZOR} = \frac{L_{sh}}{N}.$$

Inserting the previously obtained values of shunt resistance ($R_{sh}$) and shunt inductance ($L_{sh}$) of unit cell 220, the Q-factor may be represented as $$Q_{ZOR\Omega} = \frac{\mu_0 \omega_0 (s + 2\lambda\coth(t/\lambda))}{2R_{eff}}.$$

Thus, in this example, the entire ohmic losses may be only due to the current in the stubs of unit cells 220. In sum, this indicates that the MTL formed using unit cells 220 may advantageously be very power efficient. Even if dielectric losses were included, the Q-factor of the zero-order-resonant MTL may be $$\frac{1}{Q_{ZOR}} = \frac{1}{Q_{ZOR\Omega}} + \tan\delta.$$

An exemplary MTL may include fifty-six 1-mm long unit cells (e.g., unit cell 220). Each such unit cell may have a parallel plate capacitor portion (e.g., the spine portion) that is shunted by two 1.8-mm long stubs of 20-μm thick dielectric with a dielectric constant of 4.2. Of course, MTLs could have other lengths with different dimensions for the various unit cells. Another example may include unit cells with d=11.5 um, l=2.0 mm, w1=0.75 um, w2=3 um, s=200 nm, and S=200 nm. The unit cell may be repeated 100 times or more, as needed to fill the required area. In this case, the capacitance of the spine may be considered negligible and the zeroth-order resonance may be a pure quarter wave resonance. In such a case the zeroth order resonant frequency may be approximately 11 GHz with no lower frequency modes and higher order modes occurring at approximately 1 GHz intervals.

Figure 3:
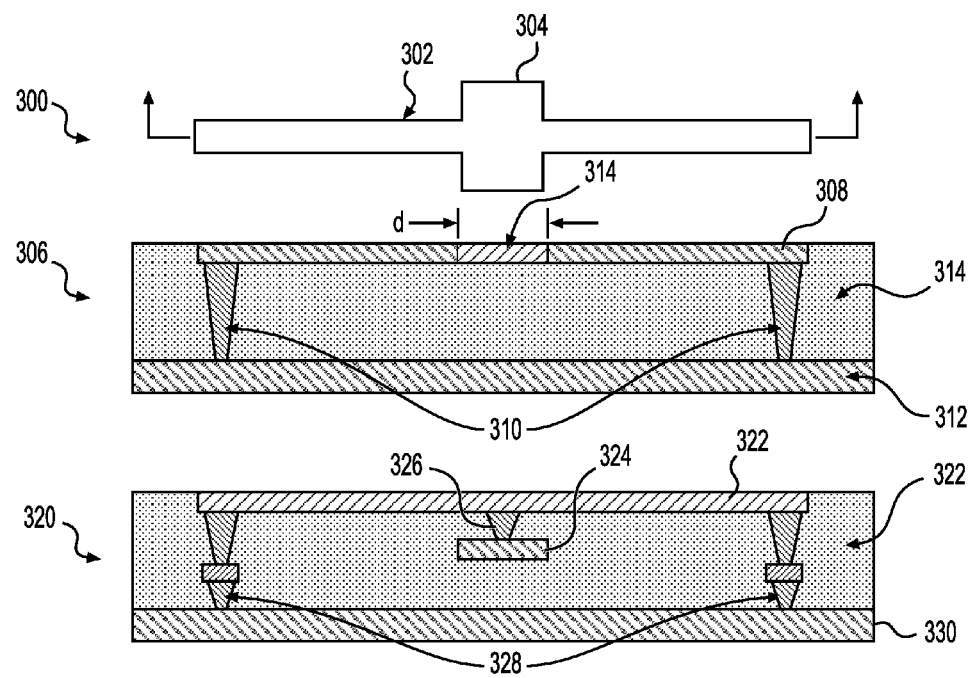
FIG. 3 shows examples of unit cells formed using multiple metal layers and dielectrics.

FIG. 3 shows examples of unit cells formed using multiple metal layers and dielectrics. Unit cell 300 may have a spine 304 and at least one stub 302. The cross-section view 306 shows that spine 314 and stub 308 are formed in one metal layer (e.g., M1). Spine 314 and stub 308 may be formed using any superconductor metal (e.g., Niobium) or normal metal (e.g., copper or aluminum). Each of stub 308 and its counterpart stub is grounded by connecting a distal end of each of the stubs to a ground plane 312 (formed in another metal layer, e.g., M0) using vias 310. The various metal layers and vias are insulated from each other using dielectric 314. Both high-k and low-k dielectrics may be used. As an example, silicon dioxide, silicon nitride, air gaps, or other types of insulators may be used as dielectrics. Cross-section view 320 shows a cross-section of a different structure for a unit cell. In this example, spine 324 may be at a different metal layer (e.g., M1) from stub 322, which may be formed in another metal layer (e.g., M2). Spine 324 may be connected to stubs (e.g., stub 322) using via 326. Stub 322 and its counterpart stub are grounded by connecting the stubs to a ground plane 330 (formed in another metal layer, e.g., M0) using vias 328. The various metal layers and vias are insulated from each other using dielectric 332. Both high-k and low-k dielectrics may be used. These examples show the provision of the shunt capacitance by a parallel plate capacitor formed by the spine. Alternatively, in these examples, in order to minimize the spine width (w), the shunt capacitance may be provided by an open-circuited stub (up to λ/4-long) that is galvanically connected to the spine, with the input impedance $Z_{inC} = Z_{OC} \coth(\gamma_C l_C)$ where $Z_{OC}$ is the stub characteristic impedance given by $$Z_{0cl} = \sqrt{\frac{\mu_0}{\varepsilon_0 \varepsilon_r}} \frac{s}{w} \sqrt{1 - i\frac{2Z_{eff}}{\mu_0 \omega s}}, \gamma_C$$

is the stub complex propagation constant given by $$\gamma_{cl} = i\omega\sqrt{\varepsilon_0 \varepsilon_r \mu_0 (1 - i\tan\delta)} \sqrt{1 - i\frac{2Z_{eff}}{\mu_0 \omega s}},$$

and $l_C$ is the stub length. In one example, to provide as much as space possible for the RF bias transistors, the capacitive stubs may be offset from the clock lines. In these examples, multiple metal layers may be used to preserve space and to minimize the spine width (w). Also, the use of high-k dielectric may help in reducing the spine width (w). Although FIG. 3 shows a specific arrangement of components in certain layers to form unit cells that form a MTL, a different arrangement and different layers may be used.

Figure 4:
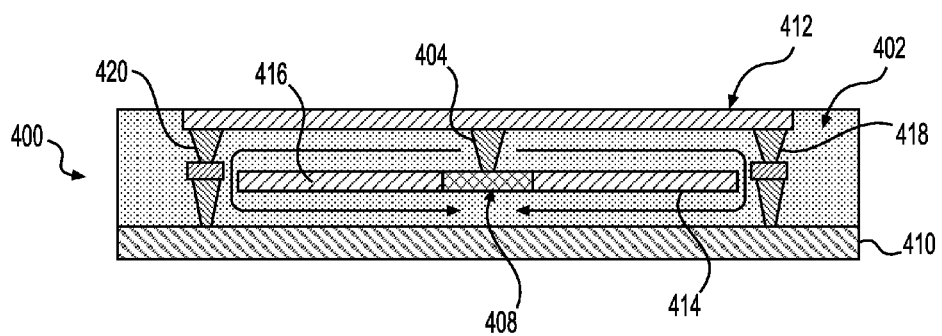
FIG. 4 shows an implementation of a unit cell in accordance with one example.

FIG. 4 shows a cross-section view 400 of another implementation of a unit cell (e.g., unit cell 112). The cross-section view 400 shows that stubs (e.g., stubs 412 and 414) are formed in two metal layers (e.g., M1 and M2). The cross-section view 400 further shows that spine 408 is formed in another metal layer (e.g., M2). Each of stub 412 and its counterpart stub is grounded by connecting the stubs to a ground plane 410 (formed in another metal layer, e.g., M0) using vias 418 and 420. The various metal layers and vias are insulated from each other using dielectric 402. Both high-k and low-k dielectrics may be used. In this example, concurrently, the path along each black arrow (shown in FIG. 4) forms a foreshortened λ/4 resonator with via 404 near spine 408 forming the shorts to ground plane 410. Two of them may form a λ/2 resonator. In this example, a voltage antinode is located between spine 408 and ground plane 410, while spine 408 provides for a "common voltage rail."

Figure 5:
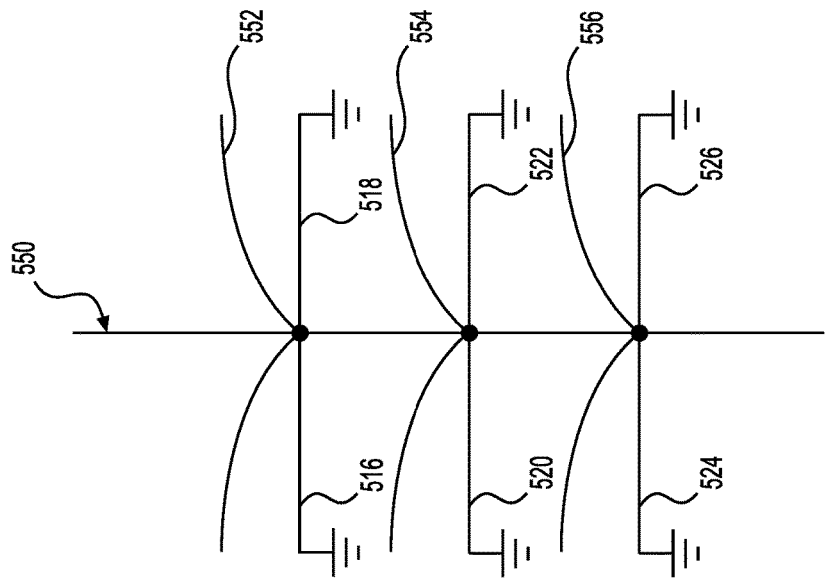
FIG. 5 shows standing waves formed along stubs of a MTL in accordance with one example.
Figure 5:
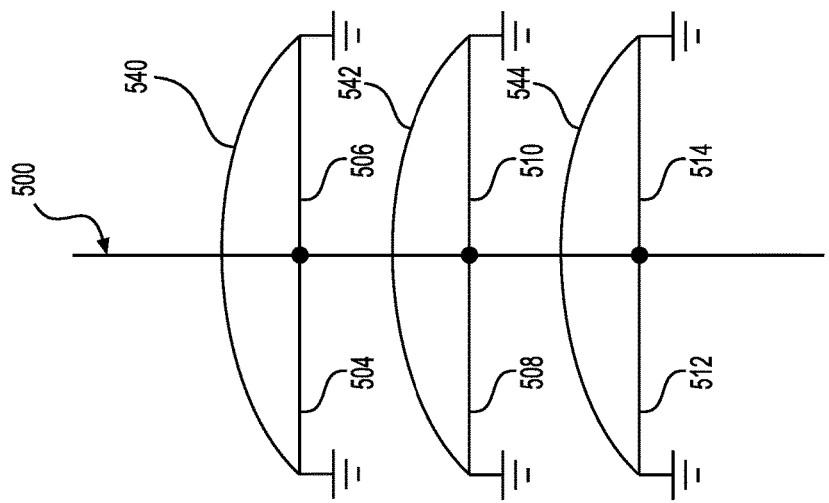

FIG. 5 shows standing waves formed along stubs of a MTL in accordance with one example. The voltage waves are shown with respect to the MTL that includes a spine 500 and stubs (e.g., 504, 506, 508, 510, 512, and 514) on each side of the spine. Each of the stubs is shown as being grounded at the ends. Standing voltage waves 540, 542, and 544 may be formed along the stubs. The standing voltage waves may create current in each of the stubs, which in turn may be coupled to the RQL or other types of superconducting circuits to provide clock/power to these circuits. Because the stubs are tied to the same source and because they are metamaterials, in one example, the phase of the current in each of the stubs may be substantially identical. The current in long spine 500, however, may be substantially zero. The current waves are shown with respect to the MTL that includes a spine 550 and stubs (e.g., 516, 518, 520, 522, 524, and 526) on each side of the spine. Each of the stubs is shown as being grounded at the ends. Standing current waves 552, 554, and 556 may be formed along the stubs.

Figure 6:
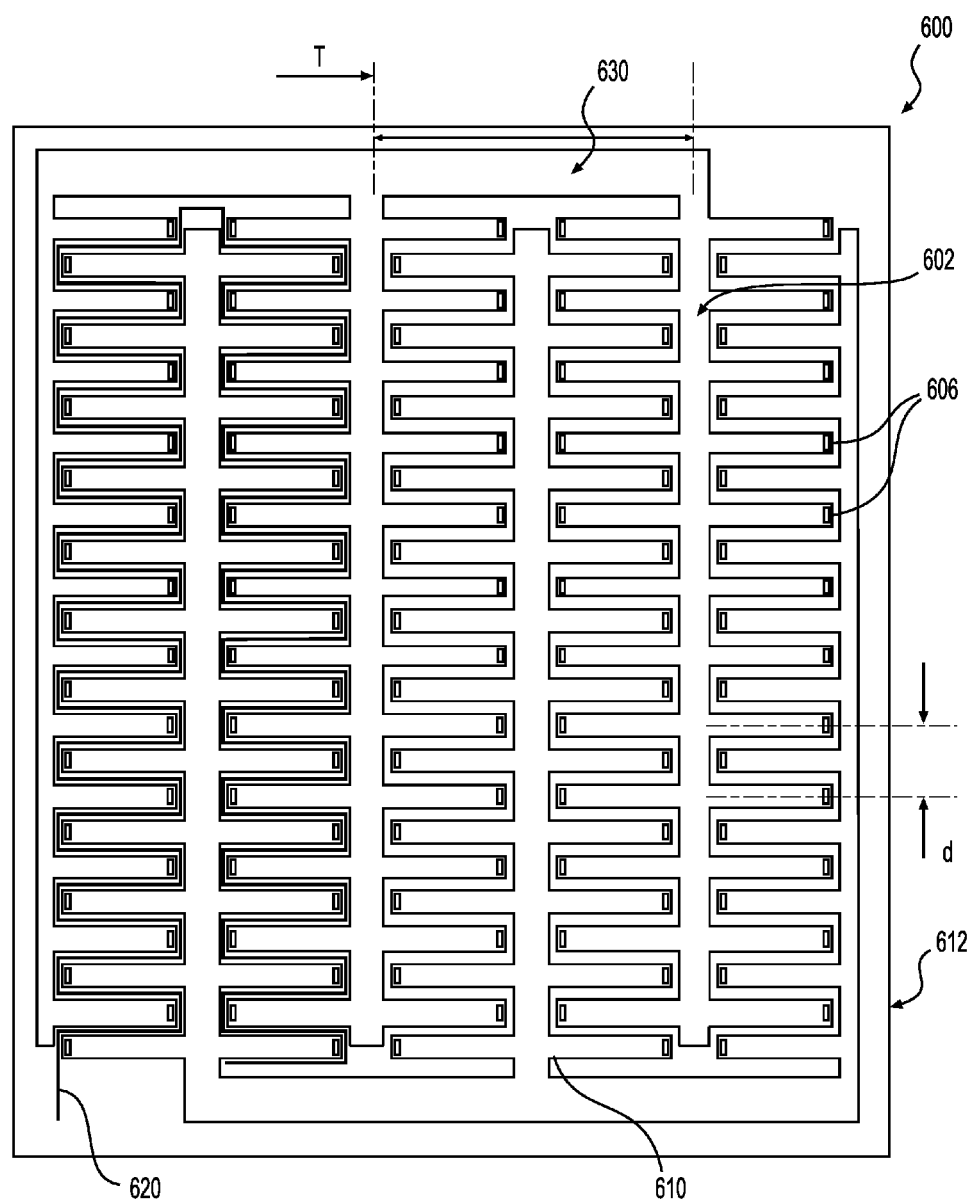
FIG. 6 shows a layout of an example resonant clock network (RCN) of clock lines for providing clock signals using MTLs.

In order to create a resonant clock network (RCN) that is capable of distributing the RF clock and power across an entire RQL chip, multiple MTLs may need to be synchronized in both amplitude and phase. As an example, two MTLs may be synchronized with a half-lambda (λ/2) long transmission line connecting their spines. Alternatively, the synchronization may be achieved with a half-lambda (λ/2) long transmission line connecting the clock-lines with the shorts removed. As discussed earlier, a RQL compatible chip may require two clock signals in quadrature, also referred to as the in-phase (I) clock signals and the quadrature (Q) clock signals. FIG. 6 shows a layout of an example RCN 600 of clock lines for providing I/Q clock signals using voltage-coupled MTLs. This example layout shows two MTLs 602, for providing the in-phase (I) clock, formed in one metal layer (e.g., M1) or multiple metal layers and two MTLs 610, for providing the quadrature (Q) clock, formed in the same metal layer (e.g., M1) or multiple metal layers. RCN 600 may further include a ground plane 612 formed in another metal layer (e.g., M0). The stubs, forming clock-lines, of the MTLs 602 and 610 may be connected to ground plane 612 using vias, such as vias 606. The stubs of each of the MTLs may be separated from each other by a distance d along the direction of the MTL clock structure. In one example, the distance d may be less than one-tenth of λ, where λ is the wavelength corresponding to the clock signals to be distributed via RCN 600. In addition, as shown in FIG. 6, two MTLs may be synchronized with transmission line 630 (with a length T) connecting their spines. In one example, transmission line 630 may be a half-lambda (λ/2) long transmission line. Due to half-spine structures near the left and the right edges of the layout, RCN 600 based on MTLs 602 and 610 is capable of covering the entire chip area. In addition, this example layout is compatible with a DC-bias line 620 meandering between MTLs 602 and 610. As part of an example implementation, a 1.3-mm-long clock-line with a 10-µm-long unit-cell may yield 4000 clock-lines per 2-cm-long double-spine. Seven pairs of such I/Q spines covering a 2×2 cm chip may aggregate to 28,000 clock-lines per chip. Thus, assuming 300 Josephson junctions per clock-line, this yields about 8 million Josephson junctions per chip. Although FIG. 6 shows a specific arrangement of components in certain layers to form RCN 600, different arrangement and different layers may be used. In addition, although not shown, RF bias transformers to couple the clock signals to RQL logic may be formed in another layer.

If the clock-line length is a significant fraction of the wavelength of the clock signals, the current amplitude may sag near the spine. To compensate for this, one may need to vary the bias transformer coupling along the length of the line to compensate for the amplitude sag. On the other hand, this may allow for a larger uninterrupted field of bias transformers, which may advantageously facilitate logic design.

The power efficiency of an example RCN (e.g., RCN 600 of FIG. 6), may be calculated as $$\eta_{RCN} = 100\% \times \frac{P_{RQL}}{P_{RQL} + P_{RCN}} = 100\% \times \frac{1}{1 + P_{RCN}/P_{RQL}},$$

where $P_{RCN}$ is the power dissipated in the clock distribution system due to energy losses in the superconductors and the dielectrics, and $P_{RQL}$ is the power consumed by the logic circuits. Since their ratio is independent of the total number of clock-lines on a chip, the power consumed by the logic circuits due to a single clock-line may be $P_{RQL}=N_j I_c \Phi_0 f/3$, where $\Phi_0$ is the flux quantum, $N_j$ is the number of Josephson junctions per clock-line, $I_c$ is the junction overage critical current, and f is the clock frequency equal to the ZOR resonant frequency. In one example, neglecting dielectric losses, $P_{RCN}$, the power dissipated in the clock distribution may be $P_{RCN}=I_0^2 R_{sh}/2$, where $I_0$ is the clock-line current amplitude. Inserting the equation for the shunt resistance ($R_{sh}$) derived earlier, taking into account that the spine carries substantially no current, and assuming $I_0=1.3\Phi_0/M_b$, yields $$\frac{P_{RCN}}{P_{RQL}} \cong \frac{5\Phi_0 R_{eff} l}{N_j I_c M_b^2 f w},$$

where $M_b$ is the mutual inductance between a clock-line and a RF bias transformer. In one example RCN, with the values for the different parameters as the following: l=1.3 mm, $N_j$=300, $I_c$=50 µA, $M_b$=2 pHn, f=10 GHz, w=2 µm, and $R_{eff}$=10 µΩ, the power efficiency ($\eta_{RCN}$) of this example RCN may be approximately 90%. Thus, the use of resonant clock network 600 may advantageously reduce the power dissipation due to clock distribution in a superconducting integrated circuit.

In conclusion, in one example, a device including a clock distribution network is described. The clock distribution network may include a first clock structure having a first plurality of unit cells, where each of the first plurality of unit cells may include at least one spine and at least one stub. The first clock structure may further include at least one spine connected to the at least one stub, where the at least one stub may further be inductively coupled to at least one first superconducting element. The clock signal may have a wavelength. Each of the first plurality of unit cells may be spaced apart from each other along the first clock structure by a distance, where the distance may be less than one tenth of the wavelength. The clock distribution network may further include a ground plane. Each of the stub may include a first stub portion extending along a first direction and a second stub portion extending along a second direction, where the first direction is opposite to the second direction. The first stub portion includes a first distal end and the second stub portion includes a second distal end, and where each of the first distal end and the second distal end is coupled to the ground plane. The clock structure may be a resonant clock structure. The clock distribution network may further include a second clock structure, and where the first clock structure is configured to provide in-phase clock signals and the second clock structure is configured to provide quadrature-phase clock signal. The second clock structure may include a second plurality of unit cells, where each of the second plurality of unit cells includes at least one spine and at least one stub, the at least one spine connected to the at least one stub, the at least one stub further inductively coupled to at least one second superconducting element.

In another example, a clock distribution network for distributing a clock signal in a superconducting integrated circuit is provided. The clock distribution network may include a first clock structure, configured to provide in-phase clock signals, and a second clock structure, configured to provide quadrature-phase clock signals. The first clock structure may have a first plurality of unit cells, where each of the first plurality of unit cells may include at least one spine and a plurality of stubs. The first clock structure may further include at least one spine connected to the plurality of stubs, where each of the plurality of stubs may further be inductively coupled to at least one first superconducting element. The clock signal may have a wavelength. Each of the first plurality of unit cells may be spaced apart from each other along the first clock structure by a first distance, where the first distance may be less than one tenth of the wavelength. The second clock structure may have a second plurality of unit cells, where each of the second plurality of unit cells may include at least one spine and a plurality of stubs. The second clock structure may further include at least one spine connected to a plurality of stubs, where each of the plurality of stubs may further be inductively coupled to at least one second superconducting element. Each of the second plurality of unit cells may be spaced apart from each other along the second clock structure by a second distance, where the second distance may be less than one tenth of the wavelength. The clock distribution network may include a first transformer for inductively coupling the at least one first superconducting element to the first clock structure and a second transformer for inductively coupling the at least second superconducting element to the second clock structure. The clock distribution network may include a ground plane. Each of the plurality of stubs may include a first stub extending along a first direction and a second stub extending along a second direction, wherein the first direction is opposite to the second direction. The first stub may include a first distal end and the second stub may include a second distal end, and where each of the first distal end and the second distal end is coupled to the ground plane. The first clock structure and the second clock structure may be part of a resonant structure.

In a yet another example, a clock distribution network for distributing a clock signal in a superconducting integrated circuit is provided. The clock distribution network may include a first clock structure, configured to provide in-phase clock signals, and a second clock structure, configured to provide quadrature-phase clock signals. The first clock structure may have a first plurality of unit cells, where each of the first plurality of unit cells may include at least one spine and a plurality of stubs. The first clock structure may further include at least one spine connected to the plurality of stubs, where each of the plurality of stubs may further be inductively coupled to at least one first superconducting element. The first clock structure may be configured to be a first resonant structure, at a frequency of the clock signal, having substantially zero current along the at least one spine. The second clock structure may have a second plurality of unit cells, where each of the second plurality of unit cells may include at least one spine and a plurality of stubs. The second clock structure may further include at least one spine connected to a plurality of stubs, where each of the plurality of stubs may further be inductively coupled to at least one second superconducting element. The second clock structure may be configured to be a second resonant structure, at a frequency of the clock signal, having substantially zero current along the at least one spine. The clock distribution network may include a first transformer for inductively coupling the at least one first superconducting element to the first clock structure and a second transformer for inductively coupling the at least second superconducting element to the second clock structure. The clock distribution network may include a ground plane. Each of the plurality of stubs may include a first stub extending along a first direction and a second stub extending along a second direction, wherein the first direction is opposite to the second direction. The first stub may include a first distal end and the second stub may include a second distal end, and where each of the first distal end and the second distal end is coupled to the ground plane. The clock signal may have a wavelength; each of the first plurality of unit cells is spaced apart from each other along the first clock structure by a first distance, and where the first distance is less than one tenth of the wavelength, and where each of the second plurality of unit cells is spaced apart from each other along the second clock structure by a second distance, and where the second distance is less than one tenth of the wavelength.

It is to be understood that the modules and components depicted herein are merely exemplary. Alternatively, or in addition, the functionality described herein can be integrated, at least in part, with one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as a superconducting integrated circuit, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A clock distribution network for distributing a clock signal in a superconducting integrated circuit, the clock distribution network comprising:
   a first clock structure comprising a first plurality of unit cells, wherein each of the first plurality of unit cells includes at least one spine and at least one stub, the at least one spine connected to the at least one stub, the at least one stub further inductively coupled to at least one first superconducting element, wherein the clock signal has a wavelength, wherein each of the first plurality of unit cells is spaced apart from each other along the first clock structure by a distance, and wherein the distance is less than one tenth of the wavelength, and wherein the clock distribution network further comprises a second clock structure, and wherein the first clock structure is configured to provide in-phase clock signals and the second clock structure is configured to provide quadrature-phase clock signals.

2. The clock distribution network of claim 1 further comprising a transformer for inductively coupling the at least one first superconducting element to the at least one stub in the first clock structure.

3. The clock distribution network of claim 1 further comprising a ground plane.

4. The clock distribution network of claim 3, wherein each of the at least one stub comprises a first stub portion extending along a first direction and a second stub portion extending along a second direction, wherein the first direction is opposite to the second direction.

5. The clock distribution network of claim 4, wherein the first stub portion comprising a first distal end and the second stub portion comprising a second distal end, and wherein each of the first distal end and the second distal end is coupled to the ground plane.

6. The clock distribution network of claim 1, wherein the first clock structure is part of a resonant structure.

7. The clock distribution network of claim 1, wherein the second clock structure comprising a second plurality of unit cells, wherein each of the second plurality of unit cells includes at least one spine and at least one stub, the at least one spine connected to the at least one stub, the at least one stub further inductively coupled to at least one second superconducting element.

8. The clock distribution network of claim 1, wherein the at least one stub comprises a transmission line having a length, and wherein the length is approximately one fourth of the wavelength.

9. A clock distribution network for distributing a clock signal in a superconducting integrated circuit, the clock distribution network comprising:
   a first clock structure, configured to provide in-phase clock signals, comprising a first plurality of unit cells, wherein each of the first plurality of unit cells includes at least one spine and a plurality of stubs, the at least one spine connected to the plurality of stubs, each of the plurality of stubs further inductively coupled to at least one first superconducting element, wherein the clock signal has a wavelength, wherein each of the first plurality of unit cells is spaced apart from each other along the first clock structure by a first distance, and wherein the first distance is less than one tenth of the wavelength; and
   a second clock structure, configured to provide quadrature-phase clock signals, comprising a second plurality of unit cells, wherein each of the second plurality of unit cells includes at least one spine and a plurality of stubs, the at least one spine connected to the plurality of stubs, each of the plurality of stubs further inductively coupled to at least one second superconducting element, wherein each of the second plurality of unit cells is spaced apart from each other along the second clock structure by a second distance, and wherein the second distance is less than one tenth of the wavelength.

10. The clock distribution network of claim 9 further comprising a first transformer for inductively coupling the at least one first superconducting element to the first clock structure and a second transformer for inductively coupling the at least second superconducting element to the second clock structure.

11. The clock distribution network of claim 9 further comprising a ground plane.

12. The clock distribution network of claim 11, wherein each of the plurality of stubs comprises a first stub extending along a first direction and a second stub extending along a second direction, wherein the first direction is opposite to the second direction.

13. The clock distribution network of claim 12, wherein the first stub comprising a first distal end and the second stub comprising a second distal end, and wherein each of the first distal end and the second distal end is coupled to the ground plane.

14. The clock distribution network of claim 9, wherein each of the first clock structure and the second clock structure is part of a resonant structure.

15. A clock distribution network for distributing a clock signal in a superconducting integrated circuit, the clock distribution network comprising:
a first clock structure, configured to provide in-phase clock signals, comprising a first plurality of unit cells, wherein each of the first plurality of unit cells includes at least one spine and a plurality of stubs, the at least one spine connected to the plurality of stubs, each of the plurality of stubs further inductively coupled to at least one first superconducting element, wherein the first clock structure is configured to be a resonant structure, at a frequency of the clock signal, having substantially zero current along the at least one spine; and
a second clock structure, configured to provide quadrature-phase clock signals, comprising a second plurality of unit cells, wherein each of the second plurality of unit cells includes at least one spine and a plurality of stubs, the at least one spine connected to the plurality of stubs, each of the plurality of stubs further inductively coupled to at least one second superconducting element, wherein the second clock structure is configured to be a resonant structure, at the frequency of the clock signal, having substantially zero current along the at least one spine.

16. The clock distribution network of claim 15 further comprising a first transformer for inductively coupling the at least one first superconducting element to the first clock structure and a second transformer for inductively coupling the at least second superconducting element to the second clock structure.

17. The clock distribution network of claim 15 further comprising a ground plane.

18. The clock distribution network of claim 17, wherein each of the plurality of stubs comprises a first stub extending along a first direction and a second stub extending along a second direction, wherein the first direction is opposite to the second direction.

19. The clock distribution network of claim 18, wherein the first stub comprising a first distal end and the second stub comprising a second distal end, and wherein each of the first distal end and the second distal end is coupled to the ground plane.

20. The clock distribution network of claim 15, wherein the clock signal has a wavelength, wherein each of the first plurality of unit cells is spaced apart from each other along the first clock structure by a first distance, and wherein the first distance is less than one tenth of the wavelength, and wherein each of the second plurality of unit cells is spaced apart from each other along the second clock structure by a second distance, and wherein the second distance is less than one tenth of the wavelength.

* * * * *